(12) United States Patent
Jin et al.

(10) Patent No.: US 8,773,866 B2
(45) Date of Patent: Jul. 8, 2014

(54) RADIO-FREQUENCY PACKAGING WITH REDUCED RF LOSS

(75) Inventors: Jun-De Jin, Hsin-Chu (TW); Mei-Show Chen, Hsin-Chu (TW); Tzu-Jin Yeh, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 502 days.

(21) Appl. No.: 12/965,402

(22) Filed: Dec. 10, 2010

(65) Prior Publication Data

US 2012/0147578 A1    Jun. 14, 2012

(51) Int. Cl.
*H05K 7/02*    (2006.01)
*H05K 7/06*    (2006.01)
*H05K 7/08*    (2006.01)
*H05K 7/10*    (2006.01)

(52) U.S. Cl.
USPC ............ 361/783; 361/784; 361/794; 361/795

(58) Field of Classification Search
USPC .......................... 361/782–784, 790, 792–795
See application file for complete search history.

(56) References Cited

U.S. PATENT DOCUMENTS

| | | |
|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,617,702 B2 * | 9/2003 | Hsu et al. ............ 257/797 |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,889,155 B2 | 5/2005 | Ogino et al. |

(Continued)

FOREIGN PATENT DOCUMENTS

| | | |
|---|---|---|
| CN | 1476633 A | 2/2004 |
| CN | 101202274 | 6/2008 |

OTHER PUBLICATIONS

Matsuo, M., et al., "Silicon Interposer Technology for High-density Package," 2000 Electronic Components and Technology Conference, IEEE, pp. 1455-1458.

*Primary Examiner* — Tuan T Dinh
(74) *Attorney, Agent, or Firm* — Slater and Matsil, L.L.P.

(57) ABSTRACT

A device includes an interposer and a radio-frequency (RF) device bonded to a first side of the interposer. The interposer includes a first side and a second side opposite to the first side. The interposer does not have through-interposer vias formed therein. First passive devices are formed on the first side of the interposer and electrically coupled to the RF device. Second passive devices are formed on the second side of the interposer. The first and the second passive devices are configured to transmit signals wirelessly between the first passive devices and the second passive devices.

14 Claims, 3 Drawing Sheets

(56) References Cited

U.S. PATENT DOCUMENTS

| | | |
|---|---|---|
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,366,629 B2 * | 4/2008 | Ogino et al. ............... 702/113 |
| 2002/0096359 A1 | 7/2002 | Hsu et al. |
| 2008/0122074 A1 | 5/2008 | Wong et al. |

* cited by examiner

… (US 8,773,866 B2)

RADIO-FREQUENCY PACKAGING WITH REDUCED RF LOSS

BACKGROUND

Radio-frequency (RF) devices are widely used in communication systems. Various RF devices that operate at high frequencies, for example, in GHz frequency ranges, need to be integrated with other devices to form a system. Therefore, the RF devices need to be packaged in package structures.

There are several types of conventional package structures used for packaging the RF devices. In a first package structure, RF devices are formed in a device die that is stacked on a package substrate. The package substrate is further bonded to a printed circuit board (PCB) through flip-chip bonding. Bond wires are used to provide DC power to the device die, and to transmit RF signals between the device die and the package substrate. The RF signals are further transmitted to the PCB through through-package vias that are formed in the package substrate. In these package structures, the bond wires are typically very long compared to the wavelengths of the RF signals, and the RF loss on the bond wires is high. Furthermore, the formation of the bond wires may cause electrostatic discharge (ESD) that damages the RF devices. The device die and the package substrate may also have a high mismatch in coefficient of thermal expansion (CTE), and hence there may be high stresses generated in the device die.

In another one of conventional packages, RF devices are formed in a device die, wherein the device die is bonded to an interposer through a flip chip package. The interposer is stacked on a package substrate. The package substrate is further bonded to a PCB through flip-chip bonding. Bond wires are used to bond the interposer to the package substrate. The bond wires are used to provide DC power to the device die through the interposer, and to transmit RF signals between the device die and the package substrate. The RF signals are further transmitted to the PCB through through-package vias that are formed in the package substrate. Again, in these package structures, the bond wires are long compared to the wavelengths of the RF signals, and the RF loss on the bond wires is high. Furthermore, the formation of the bond wires may also cause the ESD, which damages the RF devices.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A novel 2.5 dimensional (2.5D) package structure is provided in accordance with an embodiment. The variations of the embodiment are then discussed. Throughout the various views and illustrative embodiments, like reference numbers are used to designate like elements.

Figure 1:
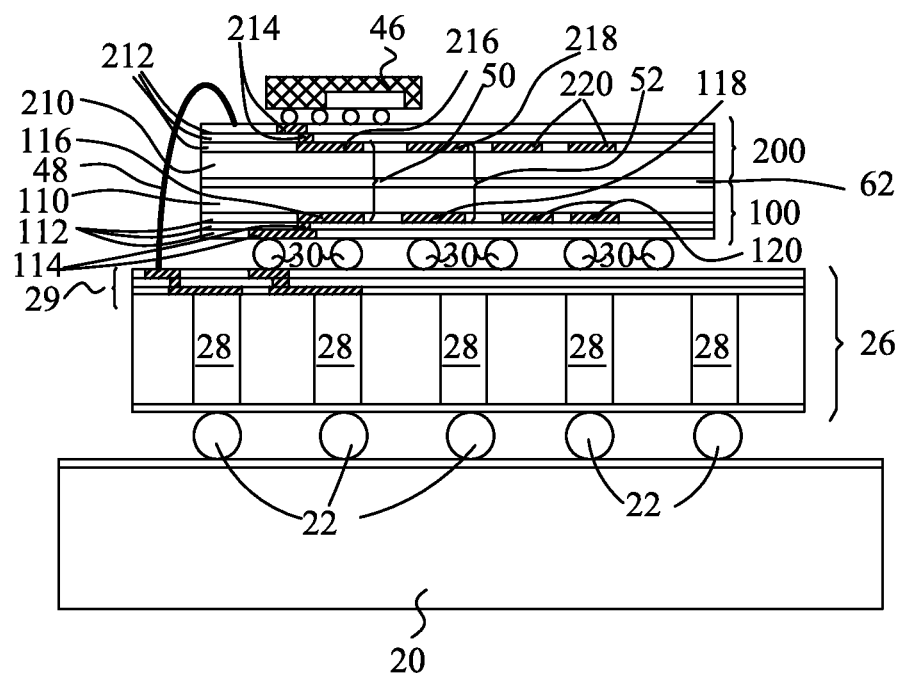
FIG. 1 illustrates a cross-sectional view of a package structure in accordance with embodiments, wherein two interposers are adhered together, with passive devices formed on a side of each of the interposers.

FIG. 1 illustrates a cross-sectional view of a package structure in accordance with an embodiment. Printed circuit board (PCB) 20 is provided. Package substrate 26 is bonded onto PCB 20, for example, through flip-chip bonding, with solder bumps 22 (also known as ball-grid array (BGA) balls) being used to join package substrate 26 and PCB 20, and to transfer signals and DC power between package substrate 26 and PCB 20. In an embodiment, package substrate 26 is formed of materials such as organic materials, ceramics, or the like. Through-package vias 28 are formed in package substrate 26. Metal layers 29, which may include metal lines and vias, may be formed on the top side of package substrate 26, wherein the DC power and the RF signals are routed through metal layers 29.

Further stacked on package substrate 26 are interposers 100 and 200. Device die 46 is further disposed over, and bonded to interposer 200 through flip-chip bonding. Device die 46 may include RF devices, such as low-noise amplifier (LNA), voltage-controlled oscillator (VCO), mixer, power amplifier (PA), antenna, therein. Interposer 100 faces down, and includes substrate 110, dielectric layer(s) 112, and metal lines and vias 114. Metal lines and vias 114 are used to route electrical signals. In an embodiment, passive devices including one or more of inductor 116, capacitor plate 118, and other passive device 120 are formed in dielectric layers 112. Passive devices 120 may be selected from the group consisting essentially of resistors, Baluns, filters (such as low-pass filters, high-pass filters, and/or band-pass filters), duplexers, capacitors, transformers, and combinations thereof. Passive devices 116, 118, and 120 may also be electrically connected to solder bumps 30 that join interposer 100 to package substrate 26. In addition, devices 116, 118, and 120 may also be constructed from the metal lines and vias in dielectric layers 112.

Interposer 200 faces up, and includes substrate 210, dielectric layer(s) 212, and metal lines and vias 214 in dielectric layers 212. Metal lines and vias 214 are used to route signals and DC power. Passive devices are formed in dielectric layers 212. In an embodiment, the passive devices formed in interposer 200 includes one or more of inductor 216, capacitor plate 218, and passive device 220, wherein passive devices 220 may be selected from the group consisting essentially of resistors, Baluns, filters (such as low-pass filters, high-pass filters, and/or band-pass filters), duplexers, capacitors, transformers, and combinations thereof. In addition, devices 216, 218, and 220 may also be constructed from the metal lines and vias in dielectric layers 112.

Substrate 110 of interposer 100 and substrate 210 of interposer 200 may be formed of a semiconductor material such as crystalline silicon, or a dielectric material such as a ceramic, a glass, an organic material, or the like. In addition, the coefficient of thermal expansion (CTE) of substrates 110 and 210 may be closer to the CTE of the overlying device die 46 than package substrate 26. Accordingly, interposers 100 and 200 have the effect of reducing the stress generated in device die 46.

Interposers 100 and 200 may be joined using, for example, adhesive 62, wherein adhesive 62 may contact substrates 110 and 210. In an embodiment, there is no through-interposer via that is formed in substrate 110 and extending from the top surface to the bottom surface of substrate 110. Similarly, there is no through-interposer via that is formed in substrate 210 and extending from the top surface to the bottom surface of substrate 210. Furthermore, in an embodiment, no metal feature is disposed between substrates 110 and 210 (for example, in adhesive 62).

Inductor 216 in interposer 200 may form transformer 50 with inductor 116, which is in interposer 100, wherein inductor 216 substantially overlaps inductor 116 vertically. Capacitor plate 218 may form capacitor 52 with capacitor plate 118, wherein capacitor plate 218 substantially overlaps capacitor plate 118 vertically. Transformer 50 and capacitor 52 are referred to as RF signal transmitting devices since RF signals may be transmitted between inductors 116 and 216, and between capacitor plates 118 and 218. Accordingly, using capacitor 52 and/or transformer 50, the RF signals may be transmitted wirelessly. For example, the RF signals may be transmitted between device die 46 and through-package vias 28 through capacitor 52 and/or transformer 50. With the wireless transmission, there is no need to use bond wires to transmit the RF signals. Accordingly, the RF loss in the otherwise used bond wires is eliminated. The electro-static discharge (ESD) caused by the bonding of bond wires is also eliminated, and hence the RF devices are free from the respective ESD damage. Furthermore, with the wireless transmission, there is no need to form through-interposer vias in interposers 100 and 200, the cost for forming the through-interposer vias in interposers 100 and 200 is thus saved.

Device die 46 may need DC connection to receive DC power supplies, for example, power supply voltage VCC, and may need the connection of VSS (which may be the electrical ground). The DC power supplies may be provided to/from device die 46 through one or more bond wire(s) 48, wherein each of bond wires 48 may include one end connected to interposer 200, and one end connected to package substrate 26. In an embodiment, there is no bond wire in the package structure that is used to transmit AC signals. In other embodiments, bond wires 48 may be used to transmit some low-frequency AC signals, for example, with frequencies lower than about 1 MHz, However, there is no bond wire in the package structure that is used to transmit RF signals, for example, with frequencies higher than about 1 MHz.

In an embodiment, the RF signals in device die 46 may be transmitted to passive devices 216, 218, and 220 in interposer 200 through metal lines and vias 214, and then coupled to passive devices 116, 118, and 120 in interposer 100, wirelessly. The RF signals are then transmitted from passive devices 116, 118, and 120 in interposer 100 to PCB 20 through through-package vias 28 and solder bumps 22. Similarly, the RF signals may be transmitted in an inverted direction, that is, from PCB 20 to passive devices 116, 118, and 120 in interposer 100 through solder bumps 22 and through-package vias 28, and then to passive devices 216, 218, and 220 in interposer 200 wirelessly. Device die 46 then receives the RF signals from passive devices 216, 218, and 220. Accordingly, device die 46 is signally coupled to package substrate 26 and to PCB 20. It is observed that in these RF signal paths, there is no bond wires involved. Accordingly, the RF loss caused by bond wires is eliminated.

Figure 2:
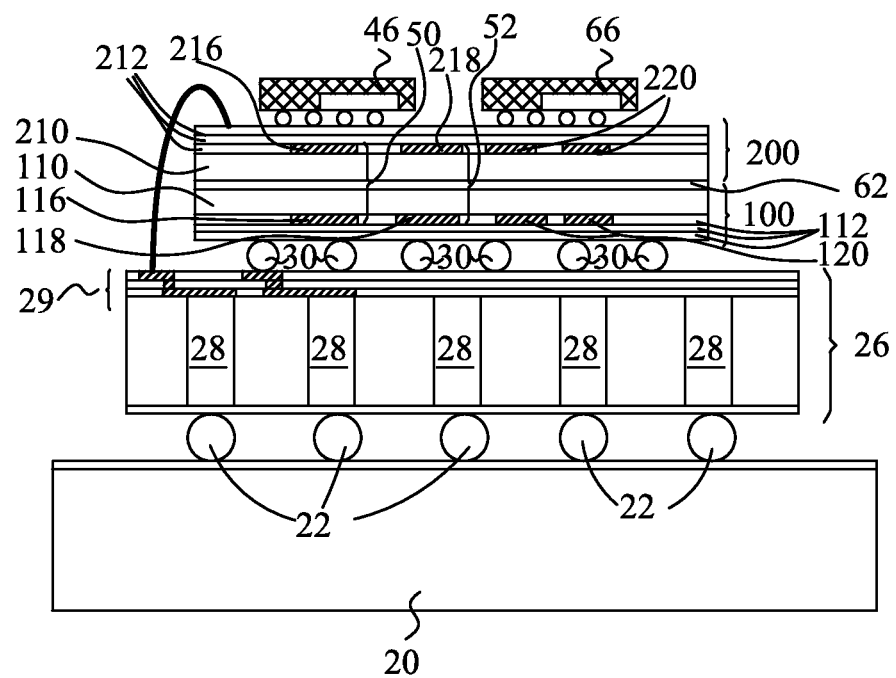
FIG. 2 illustrates a cross-sectional view of a package structure in accordance with various other embodiments, wherein a plurality of radio-frequency (RF) devices are bonded to one of two interposers.

FIG. 2 illustrates a cross-sectional view of a package structure in accordance with alternative embodiments. These embodiments are essentially the same as the embodiment shown in FIG. 1, except additional RF devices 66, which may be in the form of a device die or a discrete device, is over and bonded to interposer 200. RF device(s) 66 may be low-noise amplifiers (LNAs), mixers, oscillators, power amplifiers, and the like. Similarly, bond wires 48 may be provided for the DC power supplies and the electrical grounding, and no RF signals are transmitted through any bond wire. Interposer 100 and 200 may be free from through-interposer vias therein.

Figure 3:
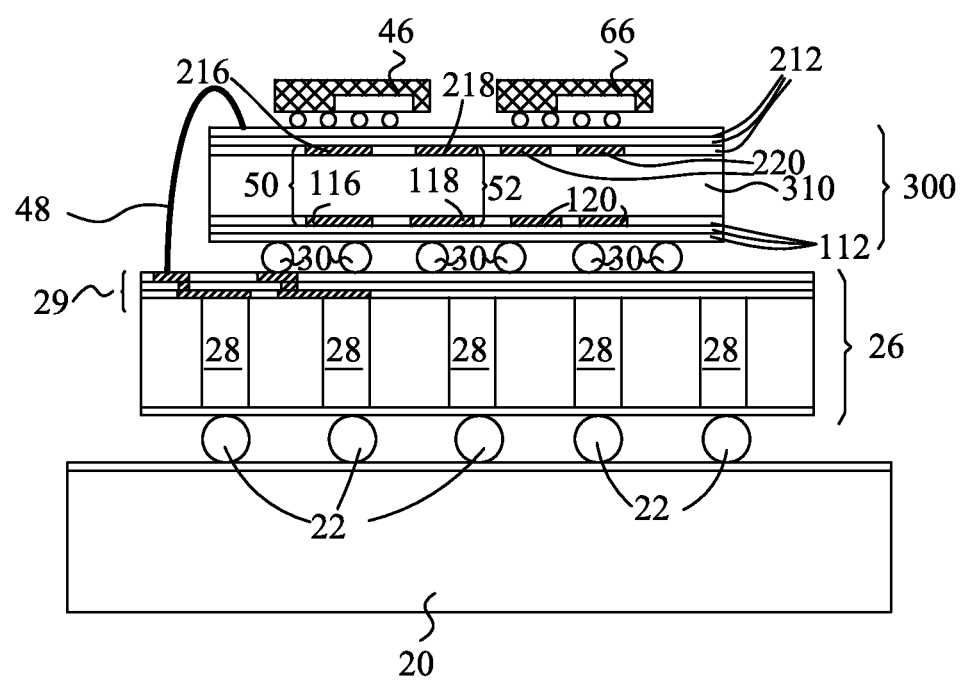
FIG. 3 illustrates a cross-sectional view of a package structure in accordance with yet other embodiments, wherein passive devices are formed on opposite sides of an interposer.

FIG. 3 illustrates a cross-sectional view of a package structure in accordance with alternative embodiments. This embodiment is essentially the same as in the embodiments in FIGS. 1 and 2, except interposer 300 replaces interposers 100 and 200 in FIGS. 1 and 2. Interposer 300 includes substrate 310, and dielectric layers 112 and 212 on opposite sides of substrate 310. Substrate 310 may be formed of as a single layer formed of one material, with no other layers formed of materials different from the one material inserted therein. Substrate 310 may also be formed of a semiconductor material such as silicon or a dielectric material such as a glass, a ceramic, an organic material, or the like. Furthermore, in embodiments, no metal is disposed in substrate 310, and no through-interposer vias are formed in substrate 310. Passive devices 116, 216, 118, 218, 120, and 220, which may be essentially the same as in the embodiments shown in FIGS. 1 and 2, are formed on opposite sides of substrate 310 and in dielectric layers 112 and 212. Similarly, bond wires 48 may be provided for the DC power supplies and grounding, and no RF signals are transmitted through bond wires that are electrically coupled to any of interposer 300, device die 46, and package substrate 26. Interposer 300 may be free from through-interposer vias therein.

The package structures in accordance with embodiments comprise interposers and stacked dies, and hence may be referred to as 2.5 dimension (2.5D) package structures. The embodiments have reduced RF loss compared to conventional package structures. Since bond wires are not used for RF communications, the RF loss caused by the bond wires are essentially eliminated. The likely yield loss and ESD damage caused by the formation of bond wires are also eliminated. Furthermore, since there are no TSVs in interposers, the cost for forming the package structures is reduced.

In accordance with embodiments, a device includes an interposer and a RF device bonded to a first side of the interposer. The interposer includes a first side and a second side opposite to the first side. The interposer does not have through-interposer vias formed therein. First passive devices are formed on the first side of the interposer and electrically coupled to the RF device. Second passive devices are formed on the second side of the interposer. The first and the second passive devices are configured to transmit signals wirelessly between the first passive devices and the second passive devices.

In accordance with other embodiments, a device includes a first interposer including a first side and a second side opposite to the first side; first passive devices on the first side of, and as a part of, the first interposer; and a second interposer including a first side and a second side opposite to the first side. The second side of the first interposer faces, and is attached to, the second side of the second interposer. No metal feature is disposed in the first and the second interposers. Second passive devices are formed on the first side of, and as a part of, the second interposer. A RF device is bonded to the first side of the first interposer. A package substrate is bonded to the first side of the second interposer through a flip chip bonding. The RF device is signally coupled to the package substrate.

In accordance with yet other embodiments, an interposer includes a substrate; first passive devices on a first side of the substrate; and second passive devices on a second side of the substrate opposite the first side. No metal features are formed in the substrate and connecting the first passive devices to the second passive devices. A RF device die is bonded to the first side of the interposer. A package substrate is bonded to the second side of the interposer. Bond wires are bonded to the package substrate and electrically coupled to the RF device die, wherein the RF device die is configured to be coupled to DC supplies through the bond wires, and wherein no bond wires bonded to the package substrate or the interposer are configured to transmit radio-frequency signals. A PCB is bonded to the package substrate through solder balls.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   an interposer comprising:
      a first side and a second side opposite to the first side, wherein the interposer does not comprise through-interposer vias therein;
      first passive devices on the first side of the interposer; and
      second passive devices on the second side of the interposer, wherein the first and the second passive devices are configured to transmit signals wirelessly between the first passive devices and the second passive devices;
   a radio-frequency (RF) device bonded to the first side of the interposer and electrically connected to the first passive devices; and
   a wireless signal transmitting device formed of the first passive device and the second passive device, wherein the wireless signal transmitting device is selected from the group consisting essentially of a capacitor and a transformer, with the capacitor comprising a first capacitor plate being a part of the first passive devices, and a second capacitor plate being a part of the second passive devices, and the transformer comprising a first inductor being a part of the first passive devices, and a second inductor being a part of the second passive devices.

2. The device of claim 1, wherein the interposer further comprises a first substrate, a second substrate, and an adhesive joining the first substrate to the second substrate, wherein the first passive devices and the adhesive are on opposite sides of the first substrate, and the second passive devices and the adhesive are on opposite sides of the second substrate.

3. The device of claim 1 further, wherein the wireless signal transmitting device comprises the capacitor.

4. The device of claim 1 further, wherein the wireless signal transmitting device comprises the transformer.

5. The device of claim 1, wherein the RF device is selected from the group consisting essentially of a low-noise amplifier (LNA), a mixer, an oscillator, a power amplifier, and combinations thereof.

6. The device of claim 1 further comprising:
   a package substrate bonded to the second side of the interposer; and
   a printed circuit board (PCB) bonded to the package substrate, wherein the interposer and the PCB are on opposite sides of the package substrate.

7. The device of claim 6 further comprising a bond wire bonded to the first side of the interposer and the package substrate.

8. The device of claim 6, wherein no bond wires are bonded onto the package substrate and configured to transmit RF signals coupled to the RF device.

9. A device comprising:
   a first interposer comprising a first side and a second side opposite to the first side;
   first passive devices on the first side of, and as a part of, the first interposer;
   a second interposer comprising a first side and a second side opposite to the first side, wherein the second side of the first interposer faces, and is attached to, the second side of the second interposer, and wherein no metal feature is disposed in the first and the second interposers;
   second passive devices on the first side of, and as a part of, the second interposer;
   a radio-frequency (RF) device bonded to the first side of the first interposer;
   a package substrate bonded to the first side of the second interposer through a flip chip bonding, wherein the RF device is signally connected to the package substrate; and
   a RF signal transmitting device comprising a first portion as a part of the first passive devices and a second portion as a part of the second passive devices, wherein the RF signal transmitting device is configured to transmit RF signals between the first and the second portions.

10. The device of claim 9, wherein the first interposer comprises a first substrate, the second interposer comprises a second substrate, and wherein the device further comprises an adhesive between and adhered to the first substrate and the second substrate.

11. The device of claim 10, wherein no through-interposer vias are formed in the first and the second substrates.

12. The device of claim 9, wherein the RF signal transmitting device is a capacitor, and wherein the first portion is a first capacitor plate of the capacitor, and the second portion is a second capacitor plate of the capacitor.

13. The device of claim 9, wherein the RF signal transmitting device is a transformer, and wherein the first portion is a first inductor of the transformer, and the second portion is a second inductor of the transformer.

14. The device of claim 9 further comprising a bond wire bonding the first side of the first interposer to the package substrate, wherein no bond wires are bonded the package substrate and configured to transmit RF signals between the package substrate and the first side of the first interposer.

* * * * *